United States Patent [19]

Hammond et al.

[11] Patent Number: 4,948,741
[45] Date of Patent: Aug. 14, 1990

[54] POLYSILICON PHOTOCONDUCTOR FOR INTEGRATED CIRCUITS

[75] Inventors: Robert B. Hammond, Los Alamos, N. Mex.; Douglas R. Bowman, Eatontown, N.J.

[73] Assignee: The United States of America as represented by the United States Department of Energy, Washington, D.C.

[21] Appl. No.: 315,449

[22] Filed: Feb. 23, 1989

Related U.S. Application Data

[60] Division of Ser. No. 147,130, Jan. 21, 1988, Pat. No. 4,821,091, which is a continuation of Ser. No. 888,311, Jul. 22, 1986, abandoned.

[51] Int. Cl.$^5$ .......................................... H01L 31/18
[52] U.S. Cl. .......................................... 437/4; 437/8
[58] Field of Search ...................... 437/4, 8, DIG. 153

[56] References Cited

U.S. PATENT DOCUMENTS

| | | | |
|---|---|---|---|
| 4,155,785 | 5/1979 | Cuomo et al. | 437/4 |
| 4,370,175 | 1/1983 | Levatter | 357/91 |
| 4,412,900 | 11/1983 | Tanaka et al. | 437/4 |
| 4,454,526 | 6/1984 | Nisitizawa et al. | 357/24 |
| 4,531,143 | 7/1985 | Maserjian | 357/58 |
| 4,821,091 | 4/1989 | Hammond et al. | 357/30 |

FOREIGN PATENT DOCUMENTS

| | | | |
|---|---|---|---|
| 56-54058 | 5/1981 | Japan | 357/51 |
| 59-111368 | 6/1984 | Japan | 357/4 |
| 0039574 | 3/1986 | Japan | 437/4 |

*Primary Examiner*—Brian E. Hearn
*Assistant Examiner*—Trung Dang
*Attorney, Agent, or Firm*—Richard J. Cordovano; Paul D. Gaetjens; William R. Moser

[57] ABSTRACT

A photoconductive element of polycrystalline silicon is provided with intrinsic response time which does not limit overall circuit response. An undoped polycrystalline silicon layer is deposited by LPCVD to a selected thickness on silicon dioxide. The deposited polycrystalline silicon is then annealed at a selected temperature and for a time effective to obtain crystal sizes effective to produce an enhanced current output. The annealed polycrystalline layer is subsequently exposed and damaged by ion implantation to a damage factor effective to obtain a fast photoconductive response.

3 Claims, 3 Drawing Sheets

ANNEAL MAGNITUDE DATA

FIG.3
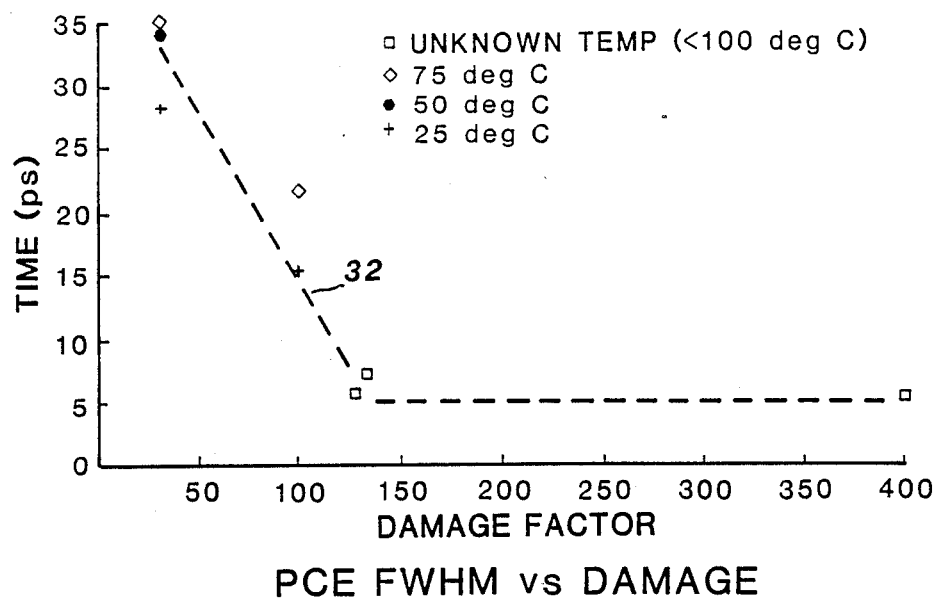
PCE FWHM vs DAMAGE
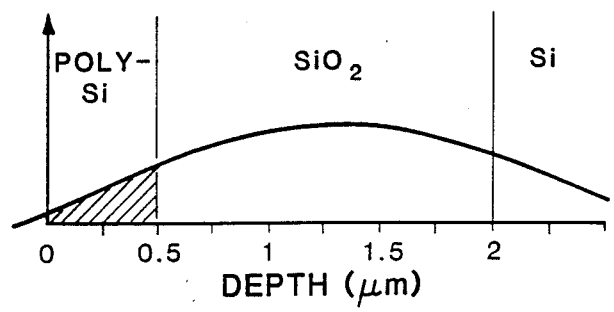
FIG.4A
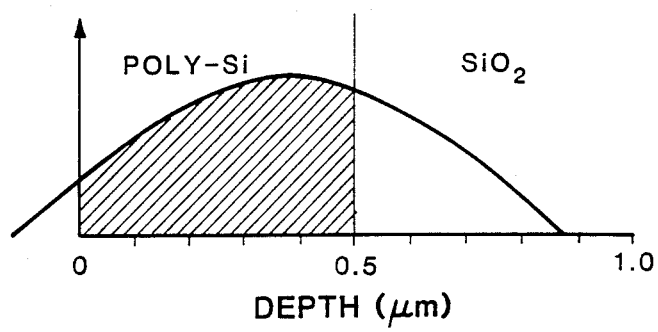
FIG.4B

POLYSILICON PHOTOCONDUCTOR FOR INTEGRATED CIRCUITS

This invention is the result of a contract with the Department of Energy (Contract No w-7405-ENG 36).

This is a division of copending application Ser. No. 07/147,130, filed on Jan. 21, 1988, now U.S. Pat. No 4,821,091 which is a continuation of application Ser. No. 06/888,311, filed July 22, 1986, now abandoned

BACKGROUND OF INVENTION

This invention relates to photoconductive elements and, more particularly, to photoconductive elements of polycrystalline silicon for integrated circuits.

Photoconductive elements (PCEs) can be used to form optoelectronic circuits for coupling a light signal with an electronic circuit. Such coupling can be used for fast response gating or for electrical sampling.

Bulk silicon (Si) is a photoconductive material. Silicon is also a common substrate for integrated circuit fabrication. Thus, optoelectronic circuits can be formed on bulk silicon using standard Si integrated circuit processes. One measure of PCE performance is the response to an input light pulse as measured by the time interval for the response rise and fall. i.e.. the full pulse width at half-maximum response (FWHM). Ion beam irradiated Si has generated pulses with 14–20 picosecond (Ps) FWHM pulses widths. Representative bulk Si performance is reported in R. B. Hammond et al.. "Integrated picosecond photoconductors produced on Bulk Si Substrates " 45 *Appl Phys. Lett.,* 404 (1984). incorporated herein by reference.

An improved PCE is formed by a polycrystalline Si (poly-Si) layer over an isolating layer of $SiO_2$. A suitable Poly-Si layer is formed using a low pressure chemical vapor deposition (LPCVD) process and an ion beam damage dose of $10^{15}$ cm$^{-2}$ of 1..6 Appl Ne. A FWHM pulse width response of 5.5 ps was obtained which was the circuit limited response rather than the intrinsic limit of the PCE.

Radiation damage to the poly-Si layer is required only through the thickness of the layer rather than the deep damage needed for bulk Si. where long-lived currents are generated deep in the substrate. Thus. Phys energy ion implanting devices could be used to enhance process compatibility with other integrated circuit components. A discussion of early poly-Si PCE performance is provided in R. B. Hammond et al.. "On-Chip. Picosecond. Electrical-Characterization measurements for Si Integrated Circuits." in *Ultrashort Pulse Spectroscopy and Aoolications.* M. J. Soileau. Ed., Proceedings of SPIE The International Society for Optical Engineering. Los Angeles, Calif. Jan. 22–23, 1985, Vol. 533, pp. 136–138. Ion damaged poly-Si had improved pulse width response but with an attendant low signal level which provided a very low signal-to-noise ratio.

This problem is addressed in the present invention and an improved poly-Si PCE is provided with a substantial increase in signal level output.

It is an object of the present invention to provide a fast response PCE with an improved signal-to-noise ratio.

It is another object to provide a fast PCE which can be integrally formed with conventional integrated circuit components.

One other object is to enable the use of commercial implanters in forming a damage profile in the poly-Si layer.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF INVENTION

To achieve the foregoing and other objects, and in accordance with the purposes of the present invention, as embodied and broadly described herein the apparatus of this invention may comprise a photoconductive element including an active layer of polycrystalline silicon formed by LPCVD processes to a selected thickness and then annealed for a predetermined time at a temperature above a temperature effective to increase the grain size of the deposited polycrystalline silicon and below a temperature to melt the polycrystalline silicon. The annealed polycrystalline silicon layer is thereafter subjected to ion implanting to a damage factor effective to obtain a desired pulse width which is very short.

In another characterization of the present invention., a process is provided for producing at least one photoconductive element on a silicon substrate. An oxide layer is formed on the silicon substrate at locations selected for the photoconductive elements and a selected thickness of polycrystalline silicon is deposited at the selected locations over the oxide. The layer of polycrystalline silicon is annealed. Conductive material is then deposited in electrical contact with the annealed polycrystalline silicon layer to complete the circuit element The annealed layer of polycrystalline silicon is then damaged by ion implantation to a damage factor effective to obtain a desired pulse width.

In one other characterization of the present invention, a process is provided for producing an integrated circuit including a photoconductive element on a silicon substrate. An oxide layer is formed on the silicon substrate in a first pattern. Areas of undoped polycrystalline silicon are then formed to a second pattern on the oxide layer. The undoped polycrystalline silicon is annealed at a temperature and for a time effective to produce an enhanced current output from the polycrystalline silicon. The annealed polycrystalline silicon area is then masked and materials are deposited to form critical junctions for components of the integrated circuit. The integrated circuit elements are then masked to effectively protect the underlying areas from ion implantation damage. The annealed undoped polycrystalline silicon areas are then exposed and damaged by ion implantation to a damage factor effective to obtain a desired pulse width from the photoconductive element formed by the polycrystalline silicon.

BRIEF DESCRIPTION OF THE DRAWINGS

The accompanying drawings, which are incorporated in and form a part of the specification, illustrate the embodiments of the present invention and, together with the description serve to explain the principles of the invention. In the drawings:

FIG. 3 is a graph illustrating response speed characterized as FWHM as a function of polycrystalline silicon damage by ion implantation.

FIGS. 4A and 4B are graphical representations illustrating damage profiles for high and low energy ion implants.

DETAILED DESCRIPTION OF THE PREFERRED EMBODIMENT

Figure 1:
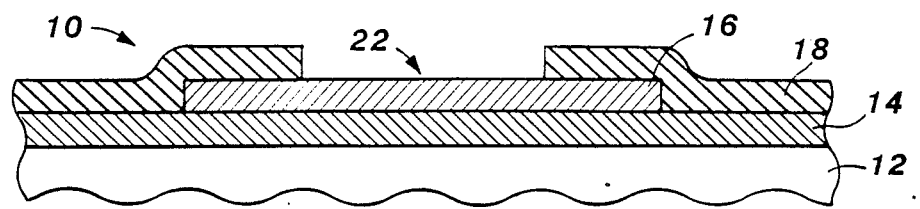
FIG. 1 is a cross section of a photoconductive element according to one embodiment of the present invention.

A cross section of a photoconductive element (PCE) according to one embodiment of the present invention is shown in FIG. 1. Silicon (Si) substrate 12 is provided to be compatible with incorporation in an integrated circuit fabrication process. Bulk silicon has been used directly to form a PCE but such circuits do not have adequate speed and signal response characteristics and improving these characteristics is not generally compatible with incorporating the PCE in an integrated circuit.

Polycrystalline silicon (poly-Si) overcomes many of the problems with using bulk silicon to form the PCE. The use of a thin film limits the region of photoconductivity to an area specifically delineated by the fabrication process and the areas are electrically isolated. The thickness of the thin film limits the depth of carrier generation under optical excitation such that recombination times are greatly reduced. An insulating layer of silicon dioxide 14 separates defined poly-Si area 16 from the substrate 12. Since the PCE is not tied electrically to the substrate, any limitations on the substrate in terms of resistivity doping type, orientation, etc. are removed and Si substrate 12 is available for forming other component elements of an integrated circuit (IC).

It is well known that the response speed of photoconductive materials, such as bulk silicon or poly-Si can be improved by introducing trapping sites in the material. Trapping sites are conventionally introduced by ion implants. Bulk silicon PCEs require very high energy implants to produce trapping sites deep in a substrate adjacent the generated carriers. This requires very high energy equipment and is incompatible with forming an overall integrated circuit since the high energy ions can not be effectively masked from underlying circuit elements. Thin film poly-Si, however, does not have the deep carrier problem and the energy required for effective ion implantation can be reduced to levels which are compatible with conventional masking for integrated circuits. Thus. IC process compatibility is greatly enhanced by the thin film poly-Si forming the PCE.

Design characteristics and constraints for PCE 10 shown in FIG. 1 are important in providing the desired operating performance and in incorporating the PCE in an integrated circuit configuration. First, the physical layout must provide optical access to PCE 10 dictating some type of planar surface structure. PCE 10 is preferably composed of a rectangular poly-Si region 16 with metallic contacts 18 at opposite sides. Contacts 18 may be formed by bringing microstrip transmission lines into contact with the photoconductive layer 16, leaving gap 22 between them to define the active area of PCE 10.

The capacitance of gap 22 and the characteristic impedance of transmission line elements 18 determine the fastest operation for which PCE 10 is capable. Preferably, PCE 10 should be imbedded in a narrow transmission line 18 with a thin poly-Si film 16 and having a gap width 22 to conductor 18 width ratio of around one. Capacitance would then be minimized while allowing acceptable processing tolerances. From a capacitance consideration a range of gap widths from 10 $\mu$m to 50 $\mu$m enables an acceptable time constant. but a gap width at the lower end of the acceptable range is preferred for maximizing the output current of the PCE 10.

As discussed above, objects of the present invention include a PCE having a high speed response and with the capability of fabrication with standard silicon IC devices. The fabrication of poly-Si films on silicon dioxide material is well within standard IC fabrication techniques. However, high speed response characteristics of the poly-Si film are obtained under the present invention by first annealing the poly-Si film and then subjecting the annealed film to implant damage wherein selected performance levels in terms of speed and signal levels are obtained. Thus, conventional IC fabrication schedules must be modified to include a high temperature anneal and post-processing implant damaging, along with additional masking steps with the modified steps provided in a sequence compatible with the fabrication of other IC components.

The fabrication of a poly-Si PCE on a silicon substrate involves the deposition and patterning of only three layers. Standard silicon wafers of any resistivity doping, or orientation are used for substrate 12. Insulating layer 14 of $SiO_2$ is thermally grown to a thickness ranging from 0.5 $\mu$m to 1.5 $\mu$m in a conventional process; the thickness is not critical for PCE operation. Undoped poly-Si may then be deposited on oxide layer 14 using a conventional LPCVD process, An acceptable poly-Si thickness of about 0.5 $\mu$m may be obtained in a conventional deposition. The poly-Si must remain undoped to achieve a high dark resistance for correct PCE operation. The PCE layer may be Patterned using standard photolithographic techniques and etching methods to produce the poly-Si area 16 forming PCE's 10.

The poly-Si area forming a PCE is now subjected to an anneal to provide improved output current in response to a light pulse. The annealing step increases the average grain size in the poly-Si material. It has been separately known that effective carrier mobility is improved in poly-Si with increased average grain sizes and it is also known that the average grain size in a poly-Si layer can be increased by a high temperature anneal. The improvement herein includes providing the annealing process before the ion damage process.

Figure 2:
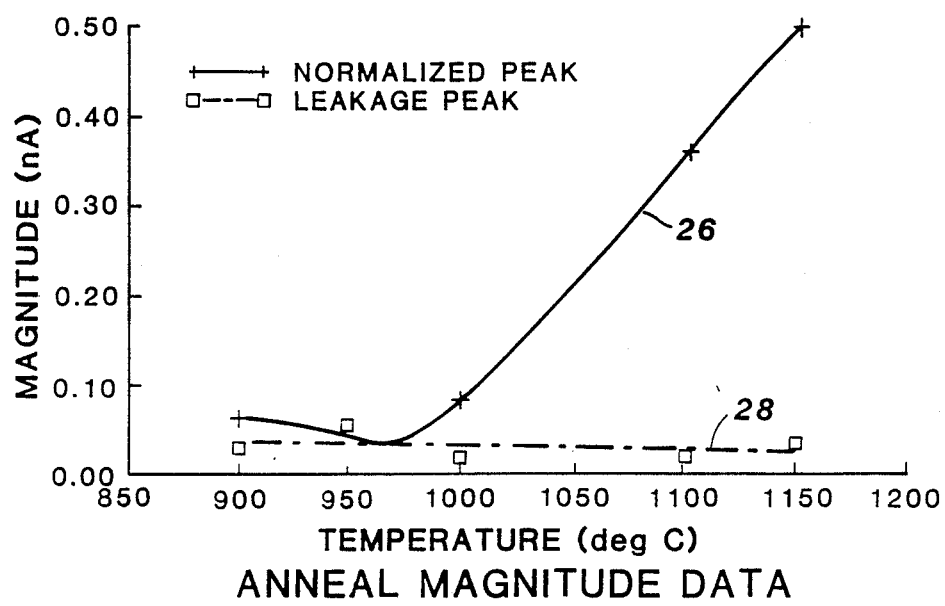
FIG. 2 is a graph illustrating current response of a photoconductive element as a function of anneal temperature according to the present invention.

FIG. 2 shows the improvement in output signal response from a PCE having a poly-Si layer annealed at various temperatures. The anneal schedule of FIG. 2 was a one hour anneal in an argon atmosphere conducted at temperatures of 900°, 950°, 1,000°, 1,100°, 1,150° C. A standardized structure having a 15 $\mu$m gap with a 100 $\mu$m width conductor 18 and with an implant damage from a 250 keV Si ions to a dose of $20_{14}/cm^2$. Improvements in the output current response begin at about 1.000° C. and continue to above 1.150° C. Temperatures over 1,200° C. are not expected, to provide any further significant improvements due to crystallinity factors as the melting point of silicon is approached. However, it will be appreciated from FIG. 2 that the output at 1,150° C. is about ten times the output at 1,000° C.

It has also been observed that the surface topology of the poly-Si layer indicates increased clumping with higher temperature anneals. The increase in surface roughness may increase the absorption of optical energy to contribute to the continued signal level improvement at higher temperature anneals.

The anneal treatment does have an effect on other characteristics of the PCE. While the leakage current increases along with the signal current, the ratio remains substantially level over the range of annealing temperatures. The anneal does act to degrade the PCE speed with a rise time slope of about 0.4 Psec/100° C. over the range of anneal temperatures. As hereinafter shown this is a relatively small effect compared with the reduction in operating speeds from ion implantation damage.

Thus, the annealed poly-Si layer provides up to an order of magnitude improvement in output signal, greatly improving the signal-to-noise ratio characteristics. If the annealed layer is now subjected to ion implantation, it is found that the operating speed can be greatly increased while retaining the signal-to-noise ratio improvements. An empirical number, the damage factor, is used to indicate the relative number of defects generated by a specific dose of the implantation ion.

Generally, a specific ion and an implant energy are selected to be compatible with the fabrication of other components in an IC. The poly-Si material is assumed to undergo substantially the same damage profile as amorphous silicon, having conventionally reported characteristics. The damage is predominantly a function of the nuclear stopping power of the implant ion and only a weak function of the implant energy allowing the number of trapping sites to be tailored by controlling only the implant species and the dose.

The product of an ion's nuclear stopping power, the percent of damage resident in the PCE layer from a reference condition, and the relative amount of damage created for a given dose can be determined. In this instance a He ion with an implant energy of 6 MeV is used as a reference. The damage factor is thus the normalized product of damage times the dose, also normalized to some base. A base dose of $10^{14}$ cm$^{-2}$ has a an implant of 6 MeV He to a dose of $10^{14}$ cm$^{-2}$ has a damage factor of 1.

The damage factor, and the corresponding amount of damage in the poly-Si layer, is a function of the density of trapping sites created by the implant, and therefore an inverse function for recombination time which determines FWHM response time. FIG. 3 demonstrates the expected function.

FIG. 3 also indicates that a minimum response time is obtained, a limitation from the circuit connected with the PCE rather than intrinsic PCE characteristics. The knee in graph 32 illustrates the circuit limited FWHM and indicates a maximum damage factor above which there is no improvement in the speed response for the PCE. Above the knee, however, the intrinsic PCE response speed can be tailored to produce response speeds slower than the circuit limited response, if desired.

FIGS. 4A and 4B illustrate some considerations in selecting an ion implanting species and an implanting energy. In FIG. 4A a high energy ion is implanted resulting in a damage profile where most of the damage is outside the thickness of the 0.5 μm poly-Si layer. By decreasing the implant energy, a damage profile according to FIG. 4B is produced. Thus, a lower energy implant actually produces a greater number of trapping sites in the poly-Si layer for a given dose and ion species.

In selecting the ion species, the minimum implant energy must be considered. The minimum implant energy is that energy below which the desired nuclear interaction is not the dominant stopping mechanism. However, to keep the implant energy within the capability of common ion implanting equipment, an energy level below 200 keV is desired. Conventional data shows that ions with atomic numbers below 16 are required to enable these implant levels. Thus, Si is the heaviest ion which can be used for the damage implant and still meet this requirement. Si, along with He, Ne, and Ar, are also desirable ions to meet the constraint that the implant species must be electrically inactive in silicon. Table A illustrates various damage factors for the reference ion implant, a 1.6 MeV Ne implant and a 250 keV Si implant.

TABLE A

| ION | ENERGY | | % DAMAGE 0.5μ POLY-Si | DAMAGE FACTOR |
|---|---|---|---|---|
| He | 6 | MeV | 11 | 1 |
| Ne | 1.6 | MeV | 10 | 13 |
| Si | 250 | keV | 66 | 133 |

Figure 5:
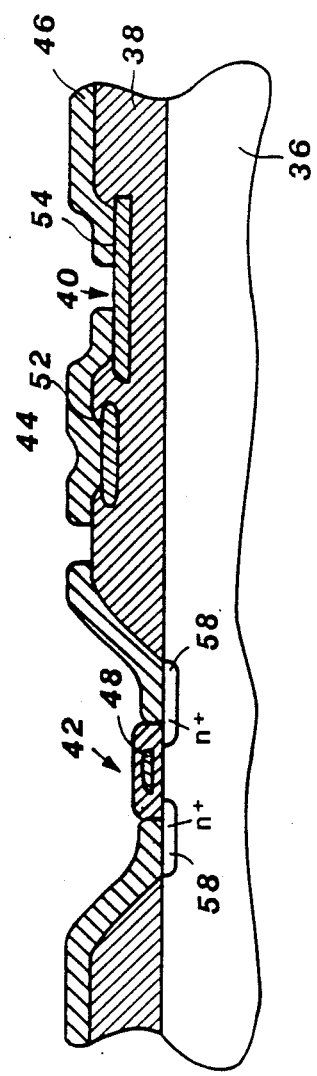
FIG. 5 is a cross section of an integrated circuit portion including a photoconductive element according to one embodiment of the present invention.

It will be appreciated that the PCE formed according to the present invention has a layer of polycrystalline silicon which is first annealed to increase grain size, resulting in an improved output signal from an incident light pulse, and the layer is thereafter damaged by ion implantation to obtain a desired response speed. The procedures herein are further compatible with integrating a poly-Si PCE into a standard IC device fabrication process. FIG. 5 illustrates in cross-section an IC device incorporating a poly-Si PCE 40 and other conventional IC components.

The fabrication process for typical IC components as depicted in FIG. 5, must accommodate the high temperature anneal and the ion implantation for poly-Si 54. Also, poly-Si layer 54 must remain in an undoped condition.

To fabricate the IC shown in FIG. 5, Si substrate 36 is provided and oxide layer 38 is formed. Undoped poly-Si layer 54 is formed on selected areas of oxide layer 38 very early in the fabrication process since the annealing temperature would substantially deepen any component junction areas formed prior to the anneal. The processing steps following the undoped poly-Si layer deposition usually include depositing oxide over the poly-Si layer as a mask to prevent doping of the layer. The oxide may remain in place, but must be removed prior to the ion implantation since the desired low energy implantation would be masked by the oxide layer.

With poly-Si layer 54 masked, a doped poly-Si area 52 may be formed using conventional fabrication techniques. Likewise, transistor 42, which may be a conventional NMOS transistor, is formed having doped n+ regions 58, formed by ion implant and a doped poly-Si gate 48.

After the remaining component process steps, the PCE damage implant step is performed. It should be noted that the conductive layer 46 is preferably formed after the anneal, but before the damage implant step since metallization involves temperatures high enough to reverse some of the implant damage. The PCE damage implant step is not generally compatible with other devices 42, 44 formed on Si substrate 36. However, according to the present invention, the implant energies in an optimized process to produce fast photoconductors are relatively low and permit non-PCE structures to be protected by conventional photoresist layers. Standard photolithographic techniques can be used to define protected areas and to expose PCE areas to be damaged. Using the techniques described herein, PCEs with greater than 100 GHz sampling bandwidth have been fabricated in a process which is compatible with standard VLSIC fabrication schedules.

The foregoing description of the preferred embodiments of the invention have been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A process for producing at least one photoconductive element on a bulk silicon substrate comprising:
   a. forming a silicon dioxide layer on said bulk silicon substrate at each location selected for a photoconductive element;
   b. depositing at each of said selected locations a layer of polycrystalline silicon, which is insulatively separated from said bulk silicon by said silicon dioxide layer and which serves as a sensing element;
   c. annealing said deposits of polycrystalline silicon, said anneal being effective to increase output current of a photoconductive element and being carried out at a temperature in the range of from about 1000° to about 1200° C. for a time period of about one hour;
   d. providing electrically conductive means which contact each of said polycrystalline silicon deposits and which define an optical access gas above each of said polycrystalline silicon deposits;
   e. subjecting each of said polycrystalline silicon deposits to damage- consisting of ion implantation which is effective to adjust response time of the photoconductive element, said response time being proportional to the damage caused to the polycrystalline silicon deposits by said ion implantation.

2. The process of claim 1 where said deposits of polycrystalline silicon are deposited by an LPCVD process and the thickness of each deposit is about 0.5 micron.

3. The process of claim 1 where said annealing temperature is about 1.150° C.

* * * * *